United States Patent
Austin et al.

[11] Patent Number: 5,720,621
[45] Date of Patent: Feb. 24, 1998

[54] ELECTRICAL DEVICE HAVING A SOLDERNESS ELECTRICAL CONTACT

[75] Inventors: Michael M. Austin, Lilburn; Grant H. Lloyd; Due Huynh, both of Lawrenceville, all of Ga.

[73] Assignee: Motorola, Inc., Schaumburg, Ill.

[21] Appl. No.: 498,204

[22] Filed: Sep. 11, 1995

[51] Int. Cl.⁶ ............................................. H01R 9/09
[52] U.S. Cl. ................................... 439/76.1; 439/862
[58] Field of Search ............................ 439/76.1, 929, 439/862, 67, 746

[56] References Cited

U.S. PATENT DOCUMENTS

| | | | |
|---|---|---|---|
| 3,842,189 | 10/1974 | Southgate | 439/66 |
| 4,226,496 | 10/1980 | Langham | 439/746 |
| 5,158,468 | 10/1992 | Curtis et al. | 439/76.1 |

*Primary Examiner*—Neil Abrams
*Assistant Examiner*—T. C. Patel
*Attorney, Agent, or Firm*—Ken Massaroni; Scott M. Garrett

[57] ABSTRACT

An electrical device (40) has a contact (58) for electrically interconnecting with a second device. The contact (58) is disposed on a rib (60) extending downward from the top of an upper housing (42) of the electrical device. The contact (58) has a cantilevered arm extending from a downward portion (68), and terminates in a contact head (78) which extend upwards through an opening (56). The downward portion (68) of the contact (58) has a contact point (72) for contacting an exposed conductor (50) deflectably mounted on a printed circuit board (46), which is disposed in a lower housing (44). When the upper and lower housings (42) and (44) are assembled together, the contact point (72) is pressed against the exposed conductor (50), deflecting it, and forming a gas tight solderless electrical connection.

14 Claims, 5 Drawing Sheets

5,720,621

ELECTRICAL DEVICE HAVING A SOLDERNESS ELECTRICAL CONTACT

TECHNICAL FIELD

This invention relates in general to electrical devices, and in particular to means for electrically interconnecting electrical devices.

BACKGROUND

With the increasing portability of electronic and electrical products, there are a growing number of devices which can be electrically interconnected with another device for some purpose. For example, some portable computers "dock" with another device which allows the portable computer to be operated as a desktop computer. These electrical interconnections are used to carry both AC and DC power, as well as analog and digital signals for control and communication purposes. For many devices, the interconnections are often implemented by means of a plug type connector having a plurality of conducting contacts. Another common type of interconnection is a pressure contact. This type is commonly used between electronic devices such as between a cellular phone and its associated battery pack, and between the battery pack and an associated charger. Such contacts rely on pressure from a spring action to force the contact from one device against the corresponding contact of the other device.

An example of such contacts is provided in FIG. 1, a side view of a contact scheme in accordance with a prior art system. Illustrated therein is a first device 10, such as a battery charger, and a second device 12, such as a battery pack. The first device 10 has a housing 14 having an opening 16 through the top. Housed inside the first device 10 is a printed circuit board 18 (PCB) having a plurality of electrical components 20 mounted thereon. In a battery charger, the electrical components would comprise circuitry for providing and controlling the recharging of a battery pack. To make the electrical interconnection(s) between the two devices, the second device is moved in the direction of arrow 22 along guiding features 24 and 26, which guide the second device 12 into the proper position for interconnection with the first device 10.

To make the electrical connection between the two devices, the first device 10 is provided with a plurality of contacts, one of which is shown as contact 28. The contacts are formed generally from a sheet of conductor such that they are substantially ribbon like, and are bent, or otherwise processed to provide the features described herein. The contact 28 has a base 30 soldered into the PCB 18. A first portion 32 extends upwards from the base along a first direction. A second portion 34 is formed by bending the first portion at some point away from the first direction to form the second portion 34 into a cantilevered spring arm. The second portion thus acts like a spring, and is terminated by contact head 36, which extends upwards through opening 16 to make electrical contact with second device contact 38 when second device 12 is inserted into first device 10. The spring action of the second portion 34 is required when multiple contacts are present. If the contact heads of the first device 10 were not spring mounted, the differences in parts and location of the parts introduced as the result of manufacturing processes would likely result in some contacts not connecting or being intermittent. By intermittent, it is meant that the electrical connection is unstable. A further design consideration is that, with each contact being a spring, the force of the contacts exerted on the second device must be less than that which will lift the second device up. If there are n number of contacts present, then the force exerted by n-1 contacts must be less than the force exerted by the second device to ensure that all n contacts make a stable electrical connection.

Contacts of the type shown in FIG. 1 present a significant manufacturing drawback. The handling of a contact prior to placement and soldering into the PCB often bends the contact. Further, as the assembled PCB is processed to solder the various components to the board, the contacts, because of their shape, often become misaligned. Each contact, because of manufacturing tolerances, may drift to a slightly different position. Due to the length of the contact a small change of position at the base is amplified at the contact head. Even if the contacts do not drift during soldering, and are not bent during placement, they are often bent when assembling the device since the contact heads must be aligned with their corresponding openings. As a result, the contacts do not protrude evenly from the device, and intermittent, unstable contacts are often found when the device is tested after assembly.

To reduce the number of misaligned contacts resulting from the soldering operation, fixtures are often employed to hold the contacts in position until the solder has hardened. However, this does not eliminate the bending of contacts prior to and during assembly. Some devices now incorporate a guide in the housing of the device for aligning the contacts. This guide is formed on a rib extending downward from the top of the housing, and incorporates rails to minimize the displacement of the contact. While such guides do reduce the effect of bending the contacts, the assembly is significantly increased in complexity, thereby increasing the assembly time. Therefore there exists a need for a contact scheme by which the contacts are better aligned after assembly of the device, and which decreases the assembly time by increasing the ease with which the device is assembled.

DETAILED DESCRIPTION OF THE PREFERRED EMBODIMENT

Figure 1:
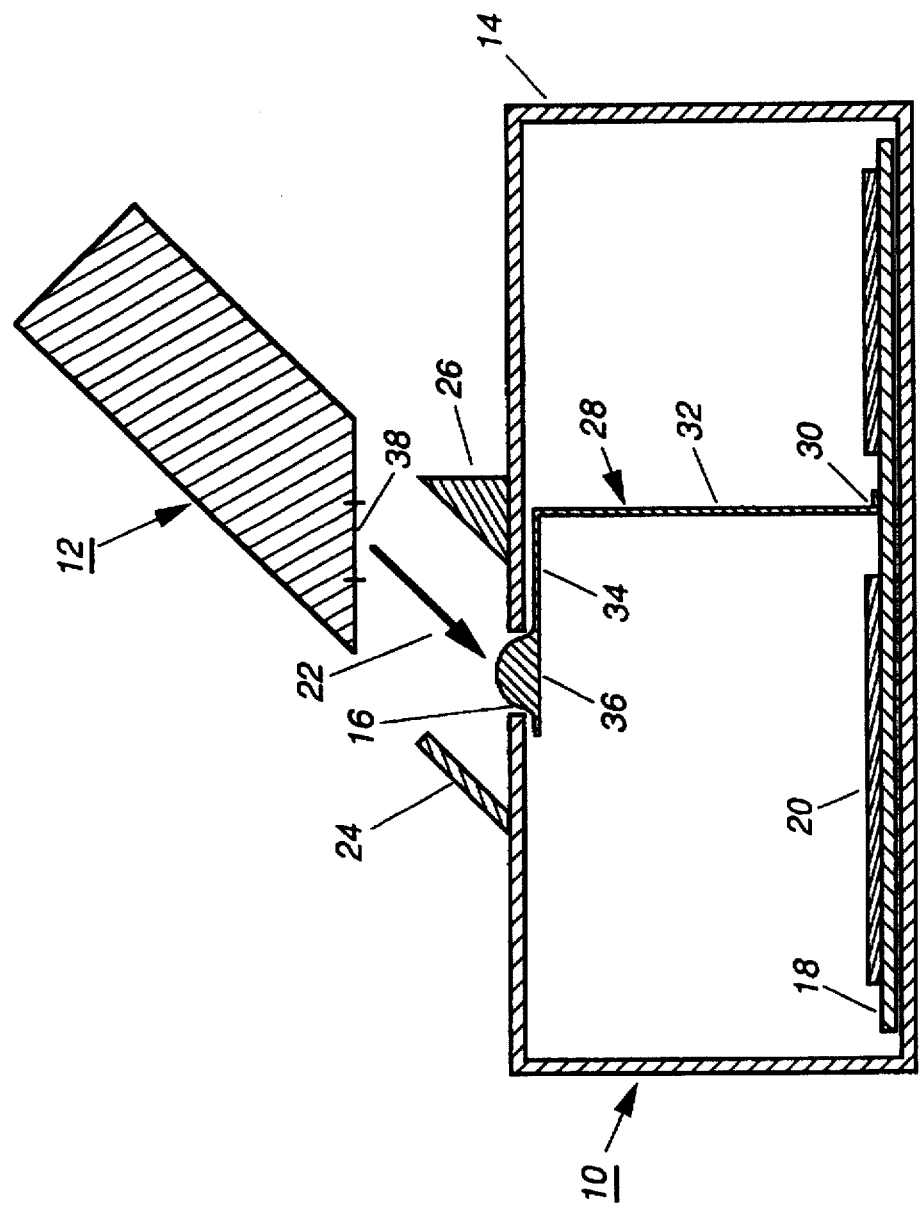
FIG. 1 illustrates a cross sectional side view of a prior art device.

While the specification concludes with claims defining the features of the invention that are regarded as novel, it is believed that the invention will be better understood from a consideration of the following description in conjunction with the drawing figures, in which like reference numerals are carried forward.

Figure 2:
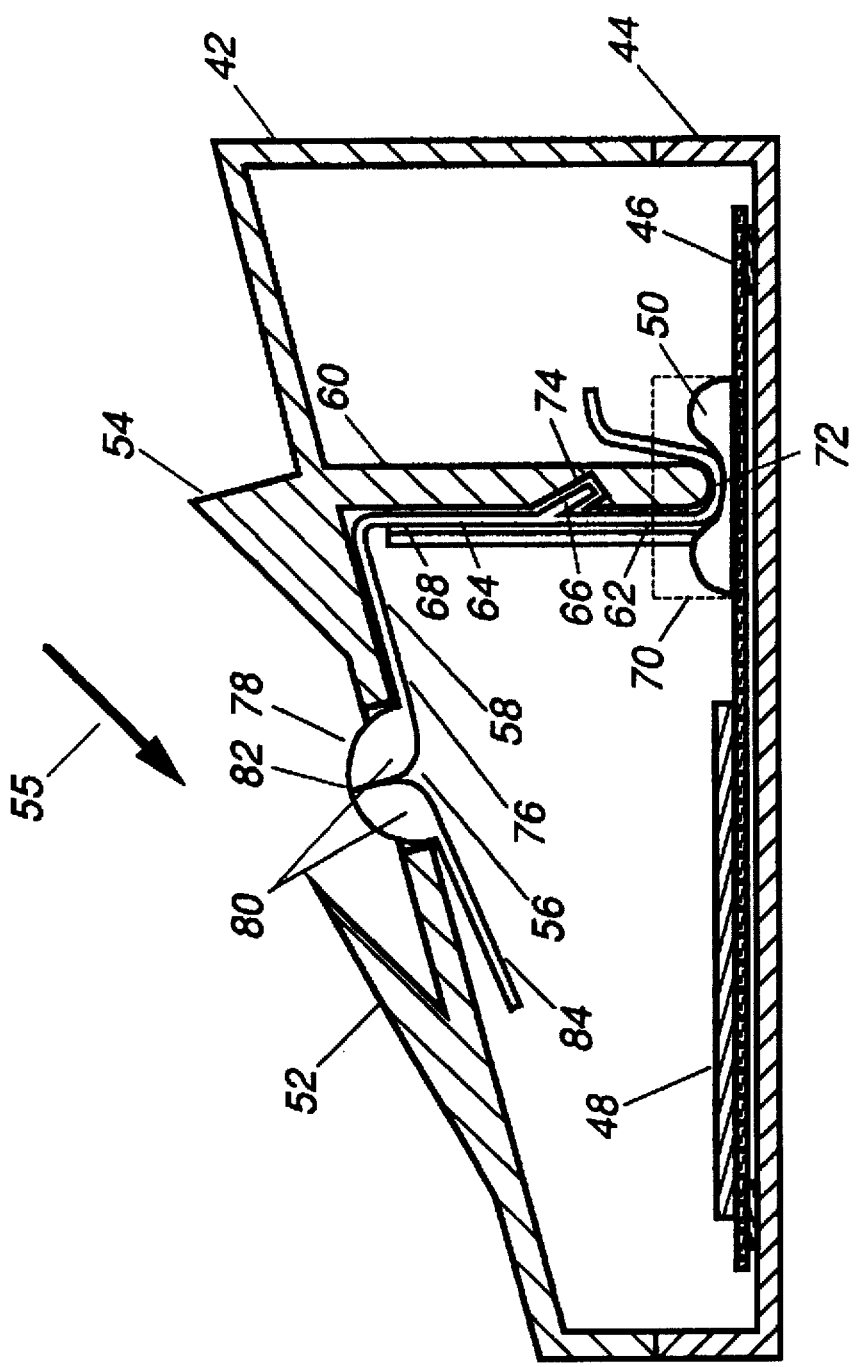
FIG. 2 illustrates a cross sectional side view of an electrical device in accordance with the invention.

Referring now to FIG. 2, there is illustrated therein a cross sectional view of an electrical device 40 in accordance with the invention. The electrical device 40 may be any one of a variety of devices which may interconnect with another device, examples of which include, but are not limited to, portable data terminal base stations, battery chargers, medical instruments, and hand held bar code scanners. Many of such devices may in fact comprise a battery charger. The electrical device 40 generally has an upper housing 42 and a lower housing 44, both typically made of plastic. Mounted in the lower housing is a printed circuit board 46 (PCB), or some similar means for mounting the device circuit 48. Deflectably mounted on the PCB 46 is an exposed conductor 50. The exposed conductor is electrically coupled to the device circuit 48. Several alternative embodiments for the exposed conductor 50 are illustrated and shown in greater detail hereinbelow.

Figure 3:
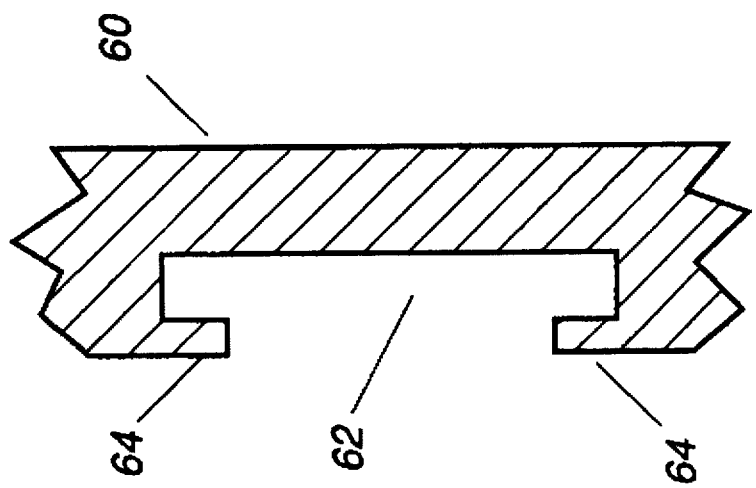
FIG. 3 illustrates a cross sectional top view of a rib with an alignment groove in accordance with the invention.

The upper housing 42 has features, such as guides 52 and 54, for receiving a second device in the direction of arrow 55. The second device could be, but is not limited to, a portable data terminal or a rechargeable battery pack. In many instances, the second device may comprise a rechargeable battery pack. The upper housing 42 further includes an opening 56 formed therethrough for exposing a portion of a contact 58, and a rib 60 extending downward from the top of the upper housing 42 to the exposed conductor 50. On one side of the rib 60 is an alignment groove 62 having two sides and a guide rail 64 on each side extending downward for at least a portion of the rib 60. Optionally, a notch 66 may be formed in the alignment groove 62 at some point along the rib 60. FIG. 3 illustrates a cross sectional top view of rib 60, and shows the rib 60, alignment groove 62, and guide rails 64. The guide rails 64 cover a portion of the alignment groove 62.

Figure 4:
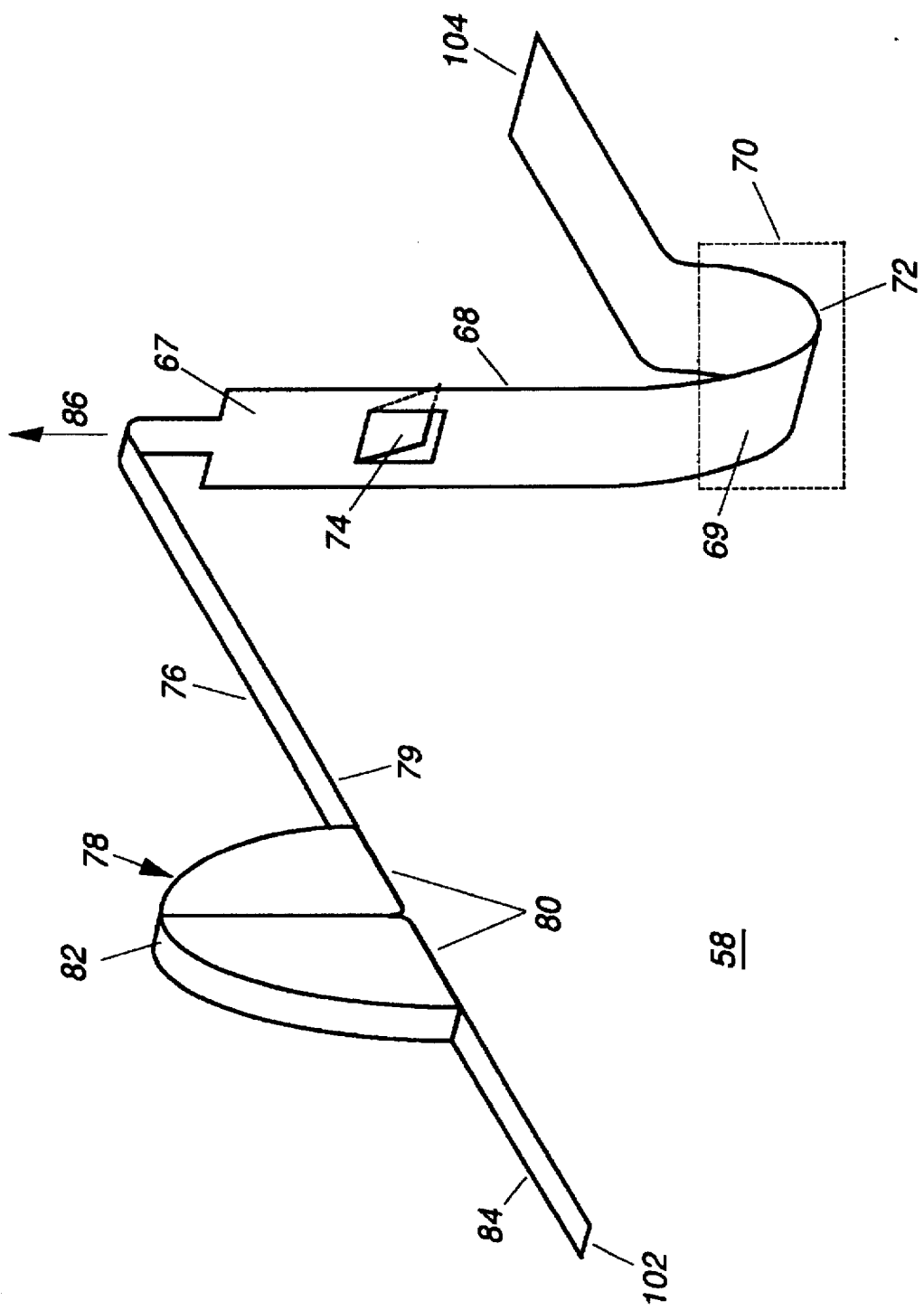
FIG. 4 illustrates a perspective view of a contact in accordance with the invention.

To more clearly illustrate how the contact 58 is mounted in the upper housing 42, FIG. 4 shows a perspective view of a contact 58 in accordance with the invention. The features of contact 58 and associated reference numerals are shown in FIGS. 2–4. The contact 58 has a downward portion 68 having upper and lower ends 67 and 69 respectively, and which extends downward and turns back upwards at the lower end to form tip 70 having a contact point 72 at the lowest point of the tip 70. The downward portion 68 has a lance 74 formed therein that extends back from the downward portion 68. Extending at an angle from the upper end of downward portion 68 is a cantilevered arm 76, which is narrower than the downward portion 68. Terminating the cantilevered arm 76 is contact head 78, which may include flaps 80, raised dimple 82, and retention finger 84.

The contact 58 is disposed partially in the alignment groove 62 by inserting the contact in the direction of arrow 86 into the alignment groove 62 at the bottom of the rib 60. The cantilevered arm 76 extends out between the guide rails 64. As the contact 58 is pushed upwards into the alignment groove 62, the lance 74 is biased towards the downward portion 68 of the contact 58 by the plastic of the rib 60. The lance 74 digs into the rib 60 as contact 58 is inserted, thus allowing movement in only one direction. Once the contact is pushed into its final position, the lance 74 prevents removal by engaging the rib 60. Preferably, the rib is fabricated of plastic, and the contact is fabricated from a material that is harder than the plastic, although it is conceived that the two elements may be fabricated from equal hardness materials. Optionally, if notch 66 is used, the lance 74 extends into notch 66 to retain the contact 58. At the same time, contact head 78, which is connected to the downward portion 68 from the distal end 79 of cantilevered arm 76, extends upwards through opening 56 formed in the upper housing 42. The force required to deflect the contact head 78 downwards, such as when a second electronic device is inserted into the first, is determined in part by the length and thickness of the cantilevered arm 76. The flaps 80 cover the two sides of the contact head 78 to prevent it from being hooked by an object when it protrudes through opening 56. The retention finger 84 serves to further distribute forces should the contact head 78 experience a pulling force. The raised dimple 82 provides a focal point for the force exerted on the contacts of any second device inserted into the first device 40, and provide a reliable way of maintaining good electrical contact stability.

Once the contact 58 has been positioned in the upper housing 42, the device is ready for assembly. The PCB 46 is mounted in the lower housing 44, and the upper and lower housings 42 and 44 are brought together. Just prior to the two housings reaching final position with respect to each other, contact point 72 comes in contact with exposed conductor 50, making a solderless electrical connection thereto. As the two housings are moved into an assembled position, the contact point 72, which is rigidly supported by the rib 60, and exposed conductor 50 exert a force on each other. The exposed conductor 50 is designed in such a way that there is a spring action associated with it, so that, as the two housing are moved closer to each other, the exposed conductor 50 yields, but provides an increasing force between it and the contact point 72. In the final assembled position, the force between the exposed conductor 50 and the contact point 72 is enough that gas is excluded from at least a portion of the area of contact between the two, allowing a reliable solderless electrical connection. This gas tight seal provides for a reliable electrical connection between the contact and the circuit 48. In this way, the contact 58 provides a reliable electrical interconnection means between the first electrical device 40 and a second device inserted into the first electrical device 40.

Figure 5:
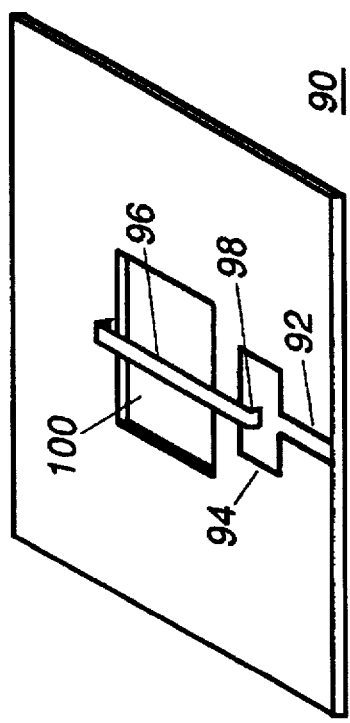
FIG. 5 illustrates a perspective view of a first preferred embodiment of a conductor on a printed circuit board in accordance with the invention.

To more clearly describe the exposed conductor 50 of FIG. 2, FIGS. 5–7 illustrate alternative embodiments of the exposed conductor 50 in accordance with the invention. Referring now to said figures, there is shown commonly a section of a PCB 90 having a conductor runner 92 terminating with a conductor pad 94 disposed thereon. FIG. 5 depicts an uninsulated wire 96 soldered to the PCB, forming a cantilevered conductor beam. At least one of the ends 98 is soldered to conductor pad 94. The opposite end of the wire is either soldered to a pad which is not electrically coupled to any portion of the circuit disposed on the PCB, or is also electrically connected to the same pad as the first end of the uninsulated wire 96. Wires such as uninsulated wire 96 are commonly used in PCB assemblies for jumping a signal over conductor runners on the PCB that interconnect various portions of the circuit disposed thereon. As such, the cost of implementing the particular embodiment depicted in FIG. 5 is very low. The diameter and length of the uninsulated wire 96 determine the spring characteristics required for the assembly of the device, as described previously. A hole 100 may optionally be provided in the PCB directly below the uninsulated wire 96 to allow displacement below the top of PCB if required. The material of the uninsulated wire 96 should be such that it resists oxidation, such as nickel or stainless steel.

Figure 7:
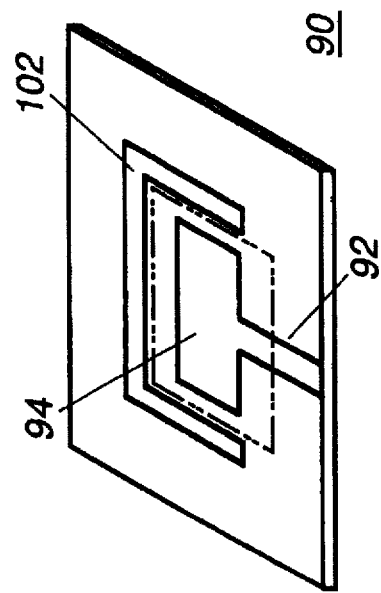
FIG. 7 illustrates a perspective view of a third preferred embodiment of a conductor on a printed circuit board in accordance with the invention.
Figure 6:
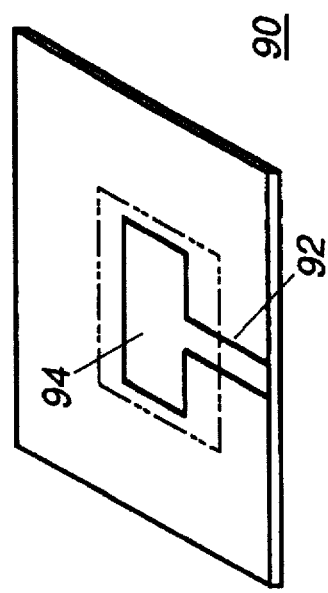
FIG. 6 illustrates a perspective view of a second preferred embodiment of a conductor on a printed circuit board in accordance with the invention.

FIGS. 6 and 7 show structure very similar to each other. In both illustrations, conductor pad 94 is exposed through a hole in the cover layer of the PCB 90. In FIG. 6, the PCB acts as the spring mechanism. This embodiment is generally intended for thinner PCBs, or even flexible PCBs with a resilient spacer located directly beneath conductor pad 94. In FIG. 7, the spring action is provided by having slot 102 cut around a majority of conductor pad 94, such that a diving board structure is provided. When the device is assembled, the diving board yields as the upper and lower housings 42 and 44 of FIG. 2 are moved together, and the contact 58 is forced downwards against conductor pad 94.

In practice, it is unlikely that only one contact would be employed. Even battery chargers need at least a positive and a negative contact. Accordingly, electrical device 40 would be provided with a plurality of openings, and rib 60 would comprise an equal number of corresponding alignment grooves, each with guide rails and notch. A contact 58 would be disposed in the alignment grooves. The PCB 46 of FIG. 2 would comprise a corresponding number of exposed conductors 50, each electrically connected to a portion of circuit 48, for providing and/or receiving signals, current levels, and voltage levels to and/or from a second electrical device.

To simplify assembly, the contacts should preferably be connected side by side together by a common carrier strip. The carrier strip would preferably connect the contacts together by distal ends 102 and 104 of FIG. 4. By doing so, a set of contacts is provided as a single piece part, and as such, significantly reduces the tendency of any single contact to bend during handling. Further, by providing a contact set in this manner, the process of inserting the contacts into the upper housing 42 is easier to automate, further reducing the possibility of bending the contacts. Once the contact set is inserted into the upper housing 42, the contacts would be singulated by removing the carrier strips. This is easily done by providing a score line between the carrier strips and the distal ends 102 and 104 of each contact, and breaking off the carrier strips by bending at the score line. Further, by mounting the contacts in the upper housing 42 and making a solderless connection to the PCB 46, the problem of drift during soldering is eliminated, and the contacts will not get bent during final assembly since the contact heads 78 are already in place, requiring no further alignment. This also significantly decreases assembly time of the electrical device 40.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An electrical device for receiving, and electrically interconnecting with, a second device, comprising:

an upper housing having a top, an opening formed therethrough;

a rib extending downward from said top of said upper housing;

a printed circuit board disposed in a lower housing, said lower housing assembled to said upper housing;

an exposed conductor deflectably mounted on said printed circuit board; and a contact disposed on said rib and having a downward portion and a contact head, said downward portion pressed against said exposed conductor, said contact head extending upwards through said opening.

2. An electrical device as defined by claim 1, wherein said electrical device is a battery charger.

3. An electrical device as defined by claim 1, wherein said rib is made of plastic and comprises an alignment groove having two sides extending downward along said rib for at least a portion thereof, a guide rail formed on each of said sides.

4. An electrical device as defined by claim 3, wherein said contact is disposed in said alignment groove, and comprises:

a lance formed in said downward portion engaging said rib; and a cantilevered arm which is narrower than said downward portion and extends from said alignment groove, said downward portion defining a contact point, said contact point being pressed against said exposed conductor.

5. An electrical device as defined by claim 1, wherein said exposed conductor is a uninsulated wire forming a cantilevered conductor beam.

6. An electrical device as defined by claim 5, wherein said printed circuit board comprises an opening therethrough beneath said uninsulated wire.

7. An electrical device as defined by claim 1, wherein said exposed conductor comprises an conductor pad disposed on said printed circuit board.

8. An electrical device as defined by claim 7, wherein said printed circuit board comprises a slot cut through said printed circuit board around a majority of said conductor pad.

9. A battery charger, comprising:

an upper housing having a top, at least one opening formed therethrough;

a rib extending downward from said top of said upper housing and including, at least one alignment groove having two sides formed therein, a guide rail formed on each of said sides;

a printed circuit board disposed in a lower housing, said lower housing assembled to said upper housing;

at least one exposed conductor deflectably mounted on said printed circuit board; and at least one contact fabricated from a material harder than said rib disposed in said at least one alignment groove having a downward portion and a contact head connected to said downward portion, said downward portion having a contact point for making a solderless electrical connection with said at least one exposed conductor, said contact head extending upwards through said at least one opening, a lance formed in said downward portion engaging said rib.

10. A battery charger as defined in claim 9, wherein said contact head is connected to said downward portion by a cantilevered arm.

11. A battery charger as defined in claim 9, wherein said at least one exposed conductor is at least one uninsulated wire forming a cantilevered conductor beam.

12. A battery charger as defined in claim 11, wherein said printed circuit board comprises at least one opening therethrough beneath said at least one uninsulated wire.

13. A battery charger as defined in claim 9, wherein said at least one exposed conductor is at least one conductor pad on said printed circuit board.

14. A battery charger as defined in claim 13, wherein said printed circuit board comprises a slot around a majority of at least one of said at least one conductor pad.

* * * * *